United States Patent
Matsushita et al.

(10) Patent No.: US 6,762,476 B2
(45) Date of Patent: Jul. 13, 2004

(54) DIELECTRIC ELEMENT INCLUDING OXIDE DIELECTRIC FILM AND METHOD OF MANUFACTURING THE SAME

(75) Inventors: Shigeharu Matsushita, Katano (JP); Tatsurou Gueshi, Hikone (JP)

(73) Assignee: Sanyo Electric Co., LTD, Osaka (JP)

( * ) Notice: Subject to any disclaimer, the term of this patent is extended or adjusted under 35 U.S.C. 154(b) by 0 days.

(21) Appl. No.: 10/060,260

(22) Filed: Feb. 1, 2002

(65) Prior Publication Data

US 2002/0105048 A1 Aug. 8, 2002

(30) Foreign Application Priority Data

Feb. 6, 2001 (JP) ......................................... 2001-029147

(51) Int. Cl.$^7$ ............................................. H01L 29/00
(52) U.S. Cl. ...................... 257/506; 257/506; 257/296
(58) Field of Search ................................ 257/506, 296, 257/295, 415, 301; 438/393, 210, 396, 780, 240; 361/303, 321.5, 200; 437/235

(56) References Cited

U.S. PATENT DOCUMENTS

| | | | |
|---|---|---|---|
| 5,111,355 A | | 5/1992 | Anand et al. |
| 5,122,923 A | | 6/1992 | Matsubara et al. |
| 5,504,041 A | * | 4/1996 | Summerfelt ................ 437/235 |
| 5,822,175 A | * | 10/1998 | Azuma .................... 361/321.5 |
| 5,843,830 A | | 12/1998 | Graettinger et al. ........ 438/396 |
| 5,998,258 A | | 12/1999 | Melnick et al. |
| 6,004,839 A | | 12/1999 | Hayashi et al. ............. 438/210 |
| 6,090,657 A | * | 7/2000 | Yamoto et al. ............. 438/240 |
| 6,178,082 B1 | | 1/2001 | Farooq et al. ............... 361/303 |
| 6,180,971 B1 | * | 1/2001 | Maejima ..................... 257/295 |
| 6,225,656 B1 | | 5/2001 | Cuchiaro et al. ........... 257/295 |
| 6,235,603 B1 | | 5/2001 | Melnick et al. ............. 438/393 |
| 6,320,213 B1 | | 11/2001 | Kirlin et al. ................ 257/295 |
| 6,329,680 B1 | | 12/2001 | Yoshida et al. ............. 257/296 |
| 6,437,391 B1 | * | 8/2002 | Oh .............................. 257/306 |
| 2001/0046789 A1 | * | 11/2001 | Taguwa ...................... 438/780 |
| 2002/0021544 A1 | * | 2/2002 | Cho et al. ................... 361/200 |
| 2002/0047172 A1 | * | 4/2002 | Reid ........................... 257/415 |

FOREIGN PATENT DOCUMENTS

| | | |
|---|---|---|
| EP | 0 886 317 A2 | 12/1998 |
| JP | 02-183569 | 7/1990 |
| JP | 08-101137 | 7/1996 |
| JP | 08-335681 | 12/1996 |
| JP | 9-289291 | 4/1997 |
| JP | 9-252094 | 9/1997 |
| JP | 10-056144 | 2/1998 |
| JP | 10-056145 | 2/1998 |
| JP | 10-93043 | 4/1998 |
| JP | 11-074488 | 3/1999 |
| JP | 11-307736 | 11/1999 |
| JP | 2000-040800 | 2/2000 |
| JP | 2000-150825 | 5/2000 |
| JP | 2000-340769 | 12/2000 |

OTHER PUBLICATIONS

Japanese Office Action, NBC 1002162, dated Jan. 24, 2003 and English Translation.

Sutsuhita, et al., "IrSiN Films with Superior Oxygen–Diffusion Barrier Effect for Stacked Ferroelectric Capacitors" Applied Physics Letters–Nov. 2000, vol. 77, No. 20 –pp. 3200–3022.

* cited by examiner

Primary Examiner—David Nelms
Assistant Examiner—Thinh T. Nguyen
(74) Attorney, Agent, or Firm—Arent Fox Kintner Plotkin & Kahn, PLLC

(57) ABSTRACT

A dielectric element capable of attaining excellent element characteristics by suppressing an oxide dielectric film from deterioration of characteristics caused by hydrogen is obtained. This dielectric element comprises a lower electrode including a first conductor film containing a metal, silicon and nitrogen, a first insulator film including the oxide dielectric film and an upper electrode including a second conductor film containing the metal, silicon and nitrogen, while the metal includes at least one metal selected from a group consisting of Ir, Pt, Ru, Re, Ni, Co and Mo. According to this structure, the first conductor film and the second conductor film function as barrier films preventing diffusion of hydrogen. Consequently, the first conductor film and the second conductor film suppress hydrogen from diffusing into the oxide dielectric film. Thus, the oxide dielectric film is prevented from deterioration of characteristics.

11 Claims, 6 Drawing Sheets

【 FIG.4 】
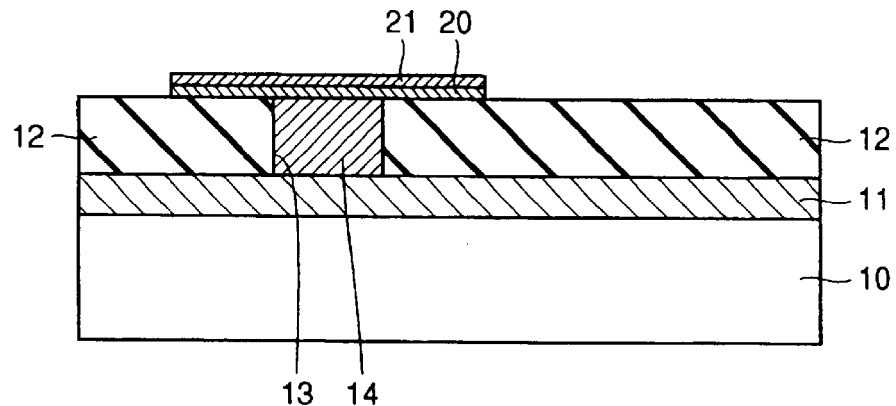
【 FIG.5 】
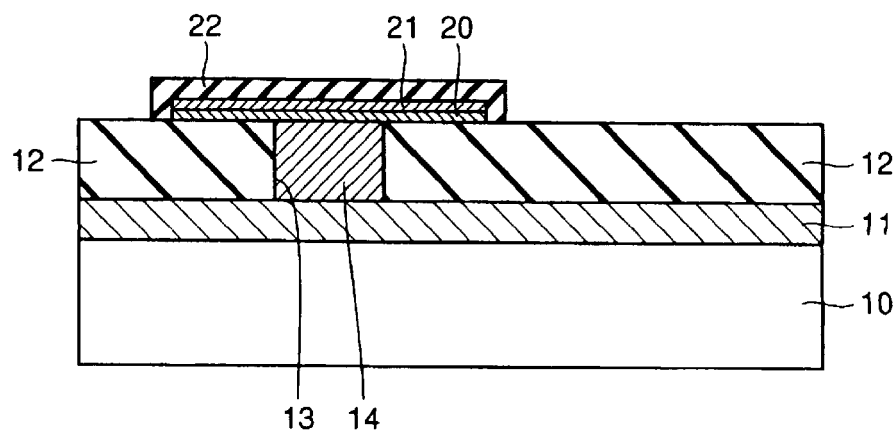
【 FIG.6 】
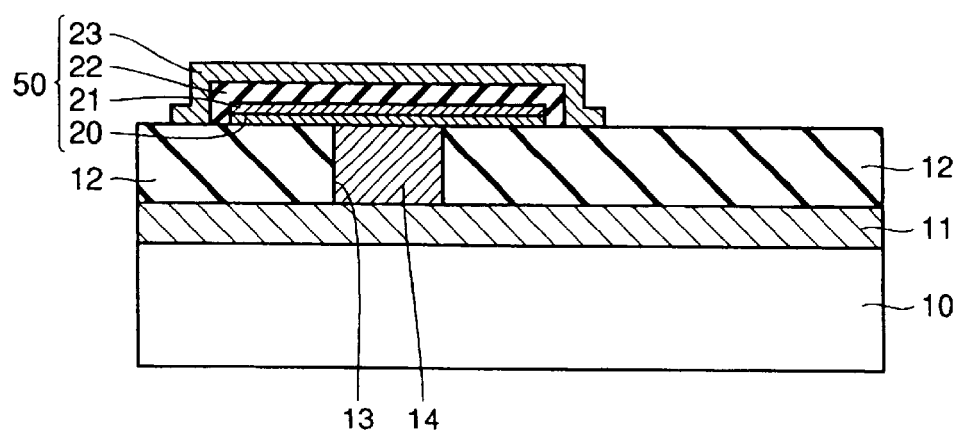

[ FIG.7 ]
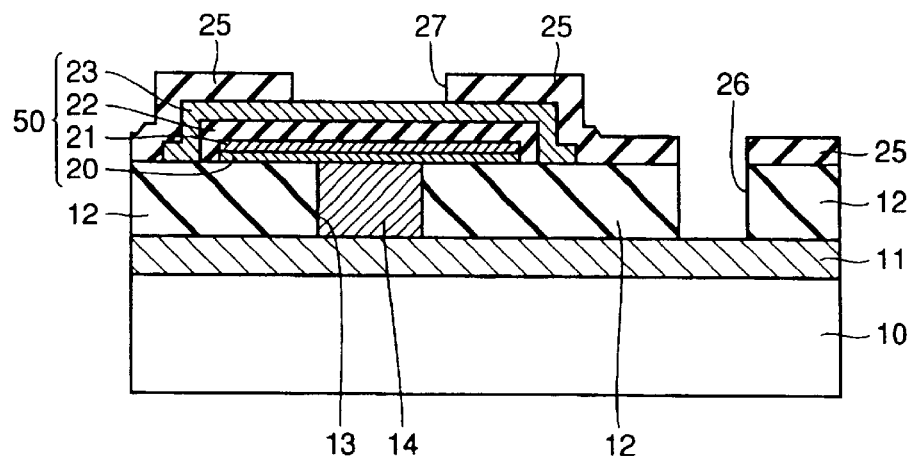
[ FIG.8 ]
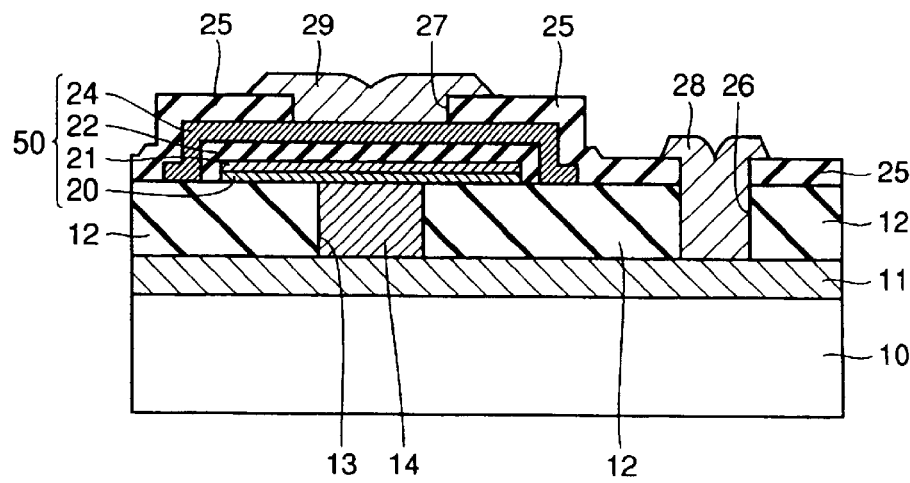

[FIG.9]
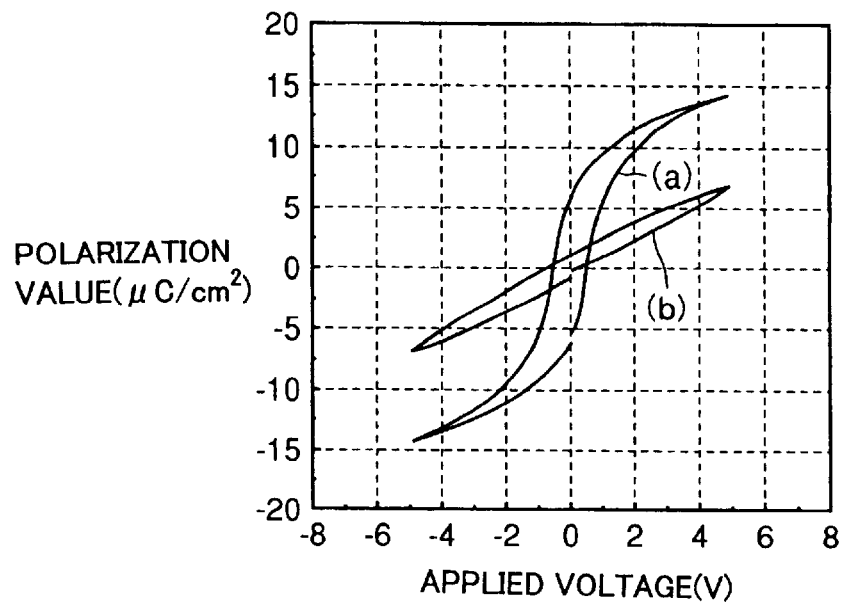
[FIG.10]
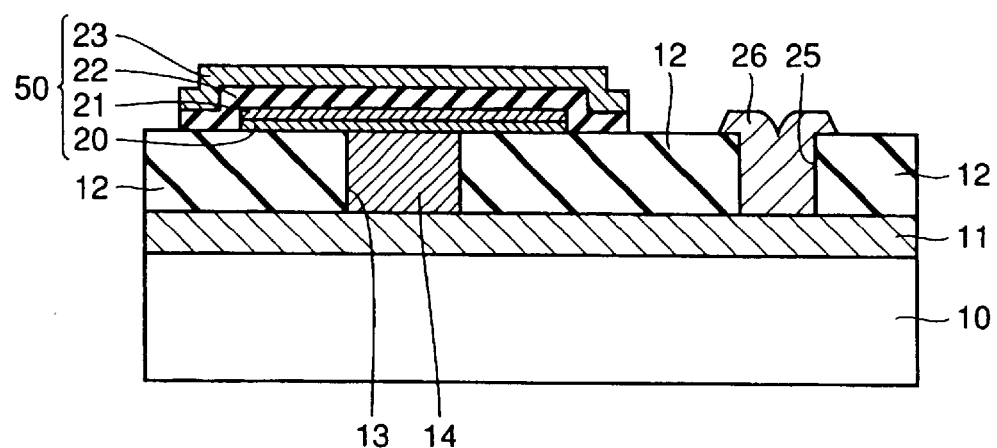

[FIG.14]
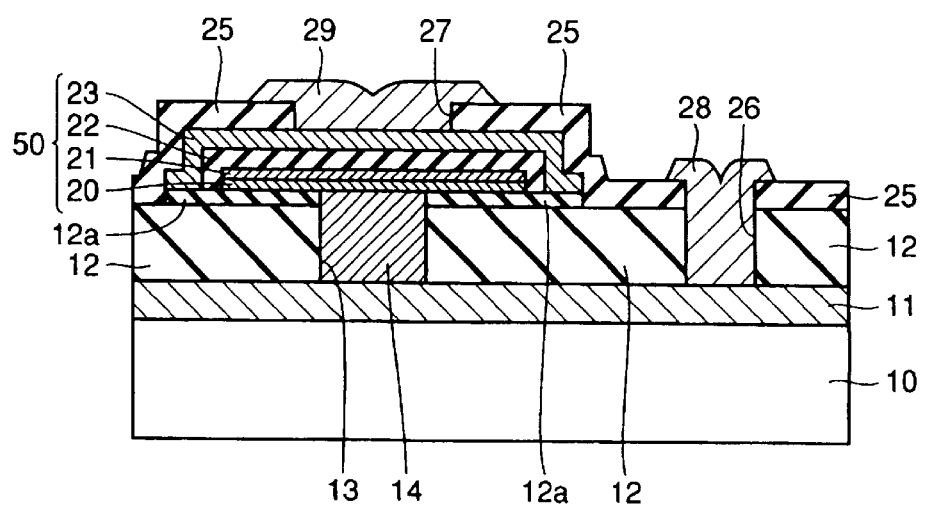

DIELECTRIC ELEMENT INCLUDING OXIDE DIELECTRIC FILM AND METHOD OF MANUFACTURING THE SAME

BACKGROUND OF THE INVENTION

1. Field of the Invention

The present invention relates to a dielectric element and a method of manufacturing the same, and more specifically, it relates to a dielectric element such as a capacitor element employing an oxide dielectric film and a method of manufacturing the same.

2. Description of the Prior Art

A ferroelectric memory is recently energetically studied as a high-speed nonvolatile memory requiring low power consumption. An oxide ferroelectric substance having a bismuth layer structure such as $SrBi_xTa_2O_9$ (SBT) or an oxide ferroelectric substance having a perovskite structure such as $PbZr_2Ti_{1-x}O_3$ (PZT) is employed as a ferroelectric material for such a memory. Also in relation to a dynamic random access memory (DRAM), employment of a high dielectric material having a higher dielectric constant than a silicon oxide film or a silicon nitride film is studied following increase of storage capacity resulting from higher densification and higher integration of a memory element. An oxide dielectric film of $SrTiO_3$ (STO), $Ta_2O_5$ or $Ba_xSr_{1-x}TiO_3$ (BST) is employed as the high dielectric material.

In a memory employing the aforementioned oxide dielectric film as a capacitor insulator film, a capacitor element is generally covered with an interlayer dielectric film such as an $SiO_2$ film or an SiN film after formation thereof.

In the process of forming such an interlayer dielectric film, however, hydrogen gas generated as a reaction product disadvantageously reduces the oxide dielectric film. Therefore, ferroelectric characteristics are deteriorated and the dielectric constant of the capacitor is reduced.

A semiconductor memory employing a MOS (metal-oxide-semiconductor) transistor as a switching transistor requires a step of recovering a lattice defect caused in a manufacturing step with gas containing hydrogen. Also in this case, ferroelectric characteristics are deteriorated and the dielectric constant of the capacitor is reduced due to hydrogen gas similarly to the above. Particularly when an electrode of the capacitor is prepared from Pt or Ir, characteristic deterioration is remarkably caused due to the catalytic action thereof.

SUMMARY OF THE INVENTION

An object of the present invention is to provide a dielectric element having excellent characteristics by suppressing diffusion of hydrogen.

Another object of the present invention is to provide a method of manufacturing a dielectric element capable of readily manufacturing a dielectric element having excellent characteristics by suppressing diffusion of hydrogen.

A dielectric element according to a first aspect of the present invention comprises a lower electrode including a first conductor film containing a metal, silicon and nitrogen, a first insulator film including an oxide dielectric film and an upper electrode including a second conductor film containing the metal, silicon and nitrogen, while the metal includes at least one metal selected from a group consisting of Ir, Pt, Ru, Re, Ni, Co and Mo.

In the dielectric element according to the first aspect, the first and second conductor films function as barrier films preventing diffusion of hydrogen in the aforementioned structure. The aforementioned metal (M) hardly forms a nitride in general or is stabilized as MxN (x≧2) when forming a nitride. When bonded with silicon (Si) and nitrogen (N), the metal (M) is more readily bonded to Si than to N, while N is readily bonded to Si. Therefore, the M-Si—N film is conceivably in a structure having Si—N embedded in metal silicide (M-Si). Thus, the M-Si—N film can conceivably have a hydrogen diffusion preventing function of the silicon nitride film (Si—N) and conductivity of the metal silicide film (M-Si) at the same time. Consequently, the first and second conductor films can prevent hydrogen from diffusing into the oxide dielectric film. Thus, the oxide dielectric film can be prevented from deterioration of characteristics.

In the dielectric element according to the aforementioned first aspect, the first insulator film including the oxide dielectric film is preferably enclosed with the lower electrode including the first conductor film, the upper electrode including the second conductor film and a second insulator film having low permeability for hydrogen. According to this structure, an end of the oxide dielectric film not covered with the first and second conductor films is also enclosed with the second insulator film having low permeability for hydrogen, whereby hydrogen can be further suppressed from diffusing into the oxide dielectric film. In this case, the second insulator film having low permeability for hydrogen is preferably removed in a region other than an element region formed with the first insulator film, the lower electrode and the upper electrode. According to this structure, hydrogen can be suppressed from infiltrating into the element region including the oxide dielectric film while a step of recovering a MOS transistor with hydrogen can be unlimitedly carried out in the region other than the aforementioned element region.

In the dielectric element including the aforementioned second insulator film, the second insulator film having low permeability for hydrogen preferably includes at least any of a silicon nitride film, a silicon oxynitride film and an aluminum oxide film. According to this structure, hydrogen can be effectively suppressed from infiltrating into the oxide dielectric film.

In the dielectric element according to the aforementioned first aspect, the first insulator film including the oxide dielectric film is preferably formed to cover the upper surface and the side surface of the lower electrode, while the upper electrode is preferably formed to cover the upper surface and the side surface of the first insulator film. According to this structure, the side surface of the first insulator film including the oxide dielectric film is not exposed sideward, whereby hydrogen can be prevented from directly infiltrating into the oxide dielectric film or the interfaces between the oxide dielectric film and the lower and upper electrodes.

In the dielectric element according to the aforementioned first aspect, the first conductor film is preferably formed on a plug. According to this structure, a stacked capacitor structure capable of preventing hydrogen from diffusing into the oxide dielectric film can be readily formed, for example. In this case, the plug preferably includes either a polysilicon plug or a tungsten plug. According to this structure, a generally employed technique of forming a polysilicon plug or a tungsten plug can be applied as such.

In the dielectric element according to the aforementioned first aspect, the lower electrode may include the first conductor film consisting of an IrSiN film and a Pt film formed on the first conductor film. The upper electrode may include the second conductor film consisting of an IrSiN film and a Pt film formed on the second conductor film. Further, the upper electrode may include a Pt film and the second conductor film, formed on the Pt film, consisting of an IrSiN film. In addition, the first insulator film including the oxide dielectric film may include an SBT film.

A method of manufacturing a dielectric element according to a second aspect of the present invention comprises steps of forming an interlayer dielectric film having an opening reaching a conductive region on a semiconductor substrate including the conductive region, forming a plug in the opening by forming a conductive material in the opening and on the interlayer dielectric film and thereafter polishing the conductive material, forming a lower electrode including a first conductive film containing a metal having at least one metal selected from a group consisting of Ir, Pt, Ru, Re, Ni, Co and Mo, silicon and nitrogen to be in contact with the plug, forming a first insulator film including an oxide dielectric film on the lower electrode and forming an upper electrode including a second conductor film containing the metal having at least one metal selected from the group consisting of Ir, Pt, Ru, Re, Ni, Co and Mo, silicon and nitrogen on the first insulator film.

In the method of manufacturing a dielectric element according to the second aspect, a dielectric element having excellent characteristics with the characteristics of the oxide dielectric film suppressed from deterioration resulting from hydrogen can be prepared due to the aforementioned structure.

In the method of manufacturing a dielectric element according to the aforementioned second aspect, the first insulator film including the oxide dielectric film is preferably patterned by light exposure. According to this structure, the dielectric element can be formed with no damage resulting from etching or the like when the oxide dielectric film is patterned.

In the method of manufacturing a dielectric element according to the aforementioned second aspect, the step of forming the first insulator film preferably includes a step of forming the first insulator film including the oxide dielectric film to cover the upper surface and the side surface of the lower electrode, and the step of forming the upper electrode preferably includes a step of forming the upper electrode to cover the upper surface and the side surface of the first insulator film. According to this structure, the side surface of the first insulator film including the oxide dielectric film is not exposed sideward, whereby hydrogen can be prevented from directly infiltrating into the oxide dielectric film and the interfaces between the oxide dielectric film and the lower and upper electrodes.

In the method of manufacturing a dielectric element according to the aforementioned second aspect, the plug preferably includes either a polysilicon plug or a tungsten plug. According to this structure, a generally employed technique of forming a polysilicon plug or a tungsten plug can be applied as such.

In the method of manufacturing a dielectric element according to the aforementioned second aspect, the lower electrode may include the first conductor film consisting of an IrSiN film and a Pt film formed on the first conductor film. The upper electrode may include the second conductor film consisting of an IrSiN film and a Pt film formed on the second conductor film. Further, the upper electrode may include a Pt film and the second conductor film, formed on the Pt film, consisting of an IrSiN film. In addition, the first insulator film including the oxide dielectric film may include an SBT film.

In the method of manufacturing a dielectric element according to the aforementioned second aspect, the first insulator film including the oxide dielectric film is preferably enclosed with the lower electrode including the first conductor film, the upper electrode including the second conductor film and a second insulator film having low permeability for hydrogen. According to this structure, an end of the oxide dielectric film not covered with the first and second conductor films is also enclosed with the second insulator film having low permeability for hydrogen, whereby hydrogen can be further suppressed from diffusing into the oxide dielectric film. In this case, the second insulator film having low permeability for hydrogen is preferably removed in a region other than an element region formed with the first insulator film, the lower electrode and the upper electrode. According to this structure, hydrogen can be suppressed from infiltrating into the element region including the oxide dielectric film while a step of recovering a MOS transistor with hydrogen can be unlimitedly carried out in the region other than the aforementioned element region.

In the structure of the aforementioned method of manufacturing a dielectric element, the second insulator film having low permeability for hydrogen preferably includes at least any of a silicon nitride film, a silicon oxynitride film and an aluminum oxide film. According to this structure, hydrogen can be effectively suppressed from infiltrating into the oxide dielectric film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 7 are diagrams for illustrating a process of manufacturing the capacitor element according to the first embodiment shown in FIG. 1;

FIG. 8 is a sectional view showing a comparative structure for the capacitor element according to the first embodiment shown in FIG. 1;

FIG. 9 is a characteristic diagram for illustrating effects of the capacitor element according to the first embodiment;

FIGS. 10 and 11 are sectional views showing other comparative structures for the capacitor element according to the first embodiment shown in FIG. 1;

FIG. 14 is a sectional view showing the structure of a capacitor element according to a fourth embodiment of the present invention.

DESCRIPTION OF THE PREFERRED EMBODIMENTS

Figure 1:
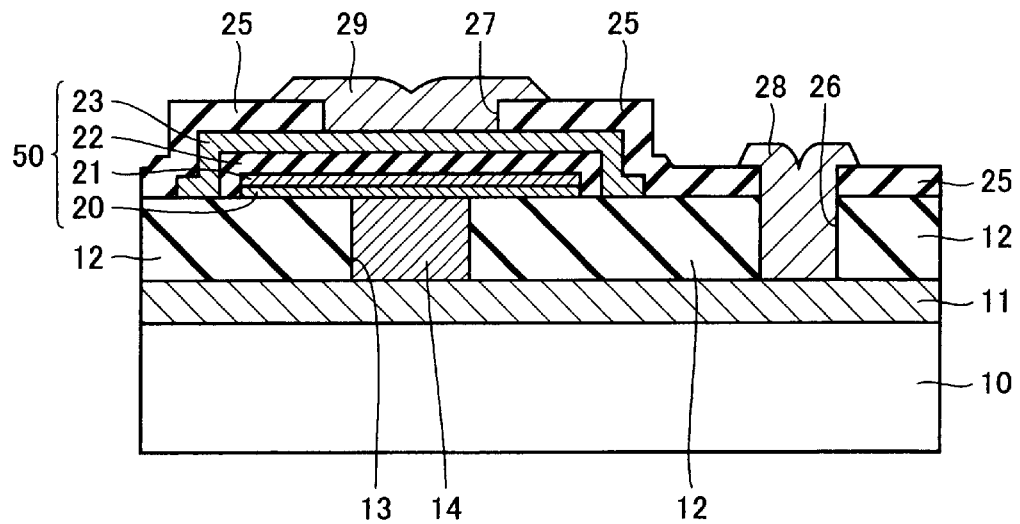
FIG. 1 is a sectional view showing the structure of a capacitor element according to a first embodiment of the present invention.

Embodiments of the present invention are now described with reference to the drawings.

(First Embodiment)

The structure of a capacitor element according to a first embodiment of the present invention is now described with reference to FIG. 1. In the capacitor element according to the first embodiment, an n-type doped layer 11 is formed on the surface of an Si substrate 10. An interlayer dielectric film 12 is formed on the n-type doped layer 11. A contact hole 13 is formed in the interlayer dielectric film 12. A tungsten plug 14 is formed in the contact hole 13. An IrSiN film 20 is formed on the interlayer dielectric film 12, to be connected with the tungsten plug 14. A Pt film 21 is formed on the IrSiN film 20. The IrSiN film 20 and the Pt film 21 form a lower electrode. An SBT film 22 of a ferroelectric substance serving as an oxide dielectric film is formed to cover the upper surface and the side surfaces of the lower electrode. An IrSiN film 23 forming an upper electrode is formed to cover the upper surface and the side surfaces of the SBT film 22.

An interlayer dielectric film 25 is formed to cover the overall surface. A contact hole 26 reaching the n-type doped layer 11 is formed in the interlayer dielectric films 12 and 25, while a contact hole 27 reaching the IrSiN film 23 is formed in the interlayer dielectric film 25. Electrodes 28 and 29 are formed in the contact holes 26 and 27 respectively. The electrodes 28 and 29 are made of TiN/Al—Si—Cu/TiN/Ti (upper layer/lower layer) or the like, for example.

A process of manufacturing the capacitor element according to the first embodiment shown in FIG. 1 is now described with reference to FIGS. 2 to 7.

Figure 2:
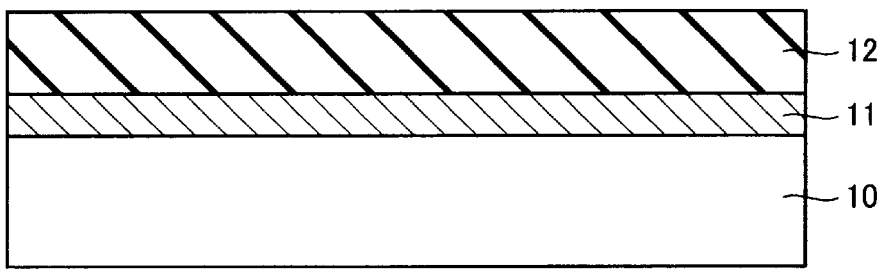

First, the n-type doped layer 11 is formed on the Si substrate 10, as shown in FIG. 2. The interlayer dielectric film 12 is formed on the n-type doped layer 11.

Figure 3:
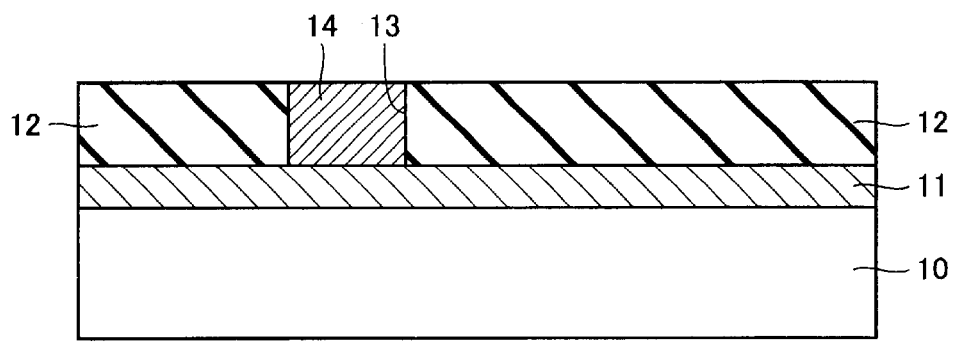

Then, the contact hole 13 is formed in the interlayer dielectric film 12, as shown in FIG. 3. Tungsten is deposited in the contact hole 13 and on the upper surface of the interlayer dielectric film 12, and thereafter an excessive part of the tungsten deposited on the interlayer dielectric film 12 is removed by CMP (chemical mechanical polishing) thereby flattening the upper surface. Thus, the tungsten plug 14 is formed as shown in FIG. 3.

Then, the IrSiN film 20 connected to the tungsten plug 14 is formed by sputtering followed by formation of the Pt film 21, as shown in FIG. 4. The IrSiN film 20 and the Pt film 21 are patterned by photolithography and etching, thereby forming the lower electrode.

Then, the SBT film 22 is formed to cover the upper surface of the Pt film 21 and the side surfaces of the Pt film 21 and the IrSiN film 20, as shown in FIG. 5. The SBT film 22 is formed by a sol-gel process allowing pattern formation by photolithography. In other words, the applied SBT film 22 is patterned by photolithography (light exposure). Then, the SBT film 22 is temporarily fired at a temperature of 200° C. for 5 minutes, and thereafter annealed in an oxygen atmosphere at a temperature of 750° C. for one hour to be sintered.

Then, the IrSiN film 23 is formed to cover the upper surface and the side surfaces of the SBT film 22, as shown in FIG. 6. This IrSiN film 23 is patterned by photolithography and etching, thereby forming the upper electrode. Thus, a capacitor 50 including the lower electrode consisting of the IrSiN film 20 and the Pt film 21, a ferroelectric film consisting of the SBT film 22 and the upper electrode consisting of the IrSiN film 23 is formed. Thereafter the capacitor 50 is annealed in an oxygen atmosphere at a temperature of 600° C. for 30 minutes.

Then, the interlayer dielectric film 25 is formed by plasma CVD (chemical vapor deposition), as shown in FIG. 7. The interlayer dielectric films 12 and 25 are prepared from $SiO_2$ or SiN. The contact hole 26 reaching the n-type doped layer 11 is formed in the interlayer dielectric films 25 and 12, while the contact hole 27 reaching the IrSrN film 23 is formed in the interlayer dielectric film 25.

Finally, the electrodes 28 and 29 are formed to fill up the contact holes 26 and 27 respectively, as shown in FIG. 1. The electrodes 28 and 29 are made of TiN/Al—Si—Cu/TiN/Ti (upper layer/lower layer) or the like, for example.

FIG. 8 is a sectional view showing the structure of a comparative capacitor element prepared to be compared with the ferroelectric capacitor according to the first embodiment shown in FIG. 1. Referring to FIG. 8, the comparative capacitor element employs a Pt film 24 in place of the IrSiN film 23 forming the upper electrode in the structure of the first embodiment shown in FIG. 1. FIG. 9 is a characteristic diagram showing polarization hysteresis characteristics of the inventive and comparative ferroelectric capacitors. Referring to FIG. 9, curves (a) and (b) show the hysteresis characteristics of the inventive and comparative ferroelectric capacitors having the structures shown in FIGS. 1 and 8 respectively. As clearly understood from the curves (a) in FIG. 9, the structure according to the first embodiment shown in FIG. 1 exhibits an excellent saturation characteristic reaching about 14 $\mu C/cm^2$ in 2Pr value (Pr: remanent polarization). In the comparative structure shown in FIG. 8, on the other hand, the hysteresis characteristic is deteriorated to about 2 $\mu C/cm^2$ in 2Pr value, as clearly understood from the curves (b) in FIG. 9.

It is clearly understood from FIG. 9 that hydrogen generated in a step of forming the interlayer dielectric film 25 after formation of the capacitor 50 can be suppressed from diffusing into the SBT film 22 due to the IrSrN film 23 employed for the upper electrode. Consequently, the capacitor characteristics can be suppressed from deterioration.

Figure 11:
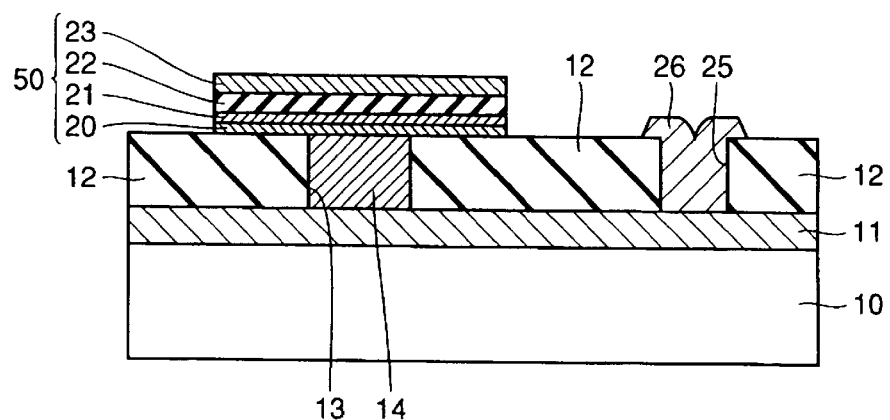

FIGS. 10 and 11 are sectional views showing further comparative structures with respect to the structure according to the first embodiment shown in FIG. 1. In each of the structures shown in FIGS. 10 and 11, side walls of an SBT film 22 serving as a ferroelectric film are exposed. In the comparative structure shown in FIG. 10 or 11, therefore, the ferroelectric film is directly exposed to a hydrogen atmosphere in a step of forming an interlayer dielectric film after formation of a capacitor or the like. In the structure according to the first embodiment shown in FIG. 1, on the other hand, the IrSiN film 23 is formed to cover the upper surface and the side surfaces of the SBT film 22, whereby the side portions of the SBT film 22 are not exposed sideward in the stage of formation of the IrSiN film 23. In other words, the SBT film 22 is enclosed with the IrSiN film 20 and the Pt film 21 forming the lower electrode, the IrSiN film 23 forming the upper electrode and the interlayer dielectric film 12 in the capacitor structure according to the first embodiment shown in FIG. 1. In the structure according to the first embodiment shown in FIG. 1, therefore, the SBT film 22 serving as the ferroelectric film is not directly exposed to the hydrogen atmosphere also when the interlayer dielectric film 25 covering the capacitor structure is formed after formation of the capacitor structure. Therefore, the structure according to the first embodiment shown in FIG. 1 can be regarded as a structure having strong resistance against hydrogen.

As hereinabove described, hydrogen can be suppressed from diffusing into the SBT film 22 by employing the IrSiN films 23 and 20 as the upper and lower electrodes respectively.

The IrSiN film 20 forming the lower electrode also functions as an oxidation-resistant barrier film in addition to the function of the hydrogen diffusion preventing barrier film. Thus, the SBT film 22 can be effectively prevented from disadvantageous separation resulting from oxidation of the tungsten plug 14 in annealing performed in an oxygen atmosphere for sintering the SBT film 22.

(Second Embodiment)

Figure 12:
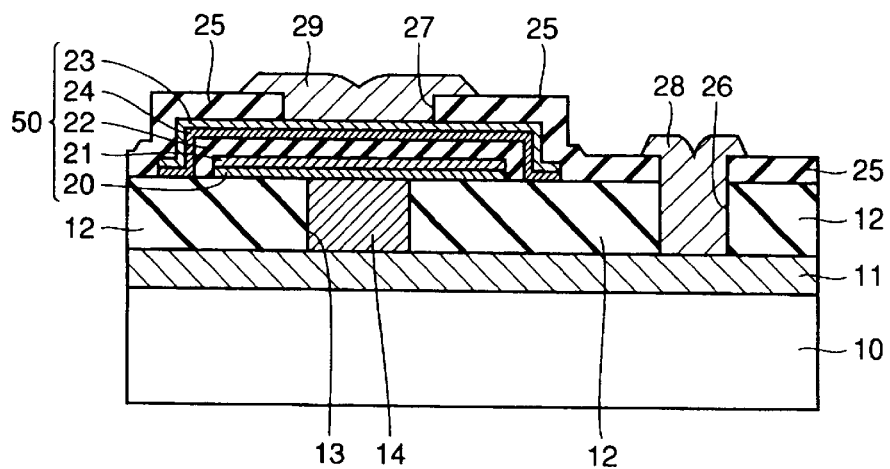
FIG. 12 is a sectional view showing the structure of a capacitor element according to a second embodiment of the present invention.

Referring to FIG. 12, a dielectric element according to a second embodiment of the present invention is prepared by inserting a Pt film 24 between an SBT film 22 and an IrSiN film 23 in a structure similar to that of the first embodiment shown in FIG. 1. According to the second embodiment, the Pt film 24 and the IrSiN film 23 formed on this Pt film 24 form an upper electrode. Also according to this structure, hydrogen can be suppressed from diffusing into the SBT film 22 similarly to the first embodiment, whereby capacitor characteristics are not deteriorated. The remaining structure of and a process of manufacturing the dielectric element according to the second embodiment are similar to those of the first embodiment.

(Third Embodiment)

Figure 13:
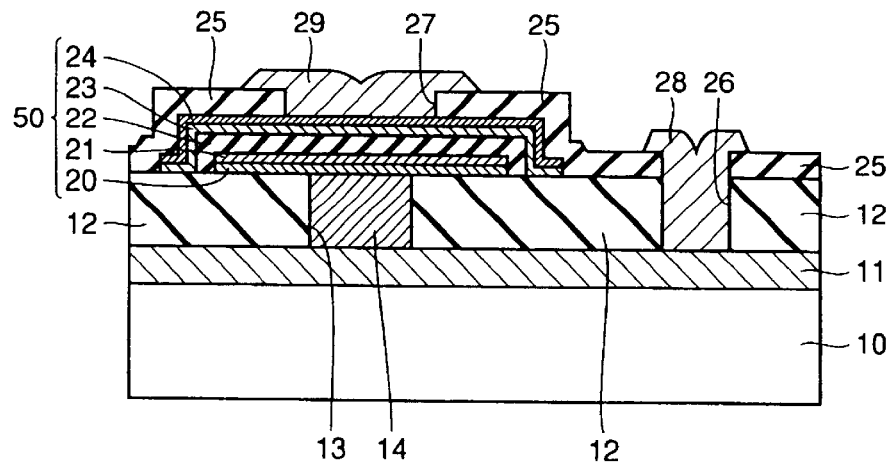
FIG. 13 is a sectional view showing the structure of a capacitor element according to a third embodiment of the present invention.

Referring to FIG. 13, a dielectric element according to a third embodiment of the present invention is prepared by depositing a Pt film 24 on an IrSiN film 23 in a structure similar to that of the first embodiment shown in FIG. 1. According to the third embodiment, the IrSiN film 23 and the Pt film 24 formed on the IrSiN film 23 form an upper electrode. Also according to this structure of the third embodiment, an IrSiN film 20 forming a lower electrode and the IrSiN film 23 forming the upper electrode can suppress hydrogen from diffusing into an SBT film 22 similarly to the first embodiment, whereby capacitor characteristics are not deteriorated. The remaining structure of and a process of manufacturing the dielectric element according to the third embodiment are similar to those of the first embodiment.

(Fourth Embodiment)

Referring to FIG. 14, a dielectric element according to a fourth embodiment of the present invention is prepared by providing an interlayer dielectric film 12a consisting of an SiN film (silicon nitride film), an SiON film (silicon oxynitride film) or an $Al_2O_3$ film (aluminum oxide film), which is an insulator film having low permeability for hydrogen, under a lower electrode of a capacitor part in a structure similar to that of the first embodiment shown in FIG. 1.

According to the fourth embodiment, An SBT film 22 serving as a ferroelectric film is enclosed with films suppressing diffusion of hydrogen due to the aforementioned structure. In other words, the SBT film 22 is enclosed with IrSiN films 20 and 23 having a hydrogen diffusion preventing function and the interlayer dielectric film 12a having low permeability for hydrogen. Thus, resistance against hydrogen diffusion is further improved as compared with the first embodiment.

According to the fourth embodiment, further, the interlayer dielectric film 12a having low permeability for hydrogen is formed only on a portion provided with a capacitor structure and removed from the remaining portions. When a semiconductor memory (not shown) is formed by combining a capacitor element and a switching transistor consisting of a MOS transistor, therefore, a step of recovering the MOS transistor with hydrogen can be carried out through the region from which the interlayer dielectric film 12a having low permeability for hydrogen is removed. Consequently, a step of recovering a lattice defect caused by gas containing hydrogen in a manufacturing step can be readily carried out.

Although the present invention has been described and illustrated in detail, it is clearly understood that the same is by way of illustration and example only and is not to be taken by way of limitation, the spirit and scope of the present invention being limited only by the terms of the appended claims.

While the IrSiN films 20 and 23 are employed as barrier films for hydrogen in each of the aforementioned embodiments, for example, the present invention is not restricted to this but a similar effect can be attained through a conductor film containing at least one of Ir, Pt, Ru, Re, Ni, Co and Mo, silicon and nitrogen. The metal (M) hardly forms a nitride in general or is stabilized as MxN ($x \geq 2$) when forming a nitride. When bonded with Si and N, the metal (M) is more readily bonded to Si than to N, while N is readily bonded to Si. Therefore, the M-Si—N film is in a structure having Si—N embedded in metal silicide (M-Si). Thus, the M-Si—N film can have hydrogen diffusion preventing ability of the silicon nitride film (Si—N) and conductivity of the metal silicide (M-Si) at the same time, for attaining a similar effect to the IrSiN films 20 and 23 of the aforementioned first embodiment.

While the ferroelectric SBT film 22 is employed as the oxide dielectric film in each of the aforementioned embodiments, the present invention is not restricted to this but another oxide ferroelectric film such as a PZT film or a film of $SrBi_2(Ta, Nb)_2O_9$ or $Bi_{4-x}La_xTi_3O_{12}$ may be employed in place of the SBT film.

While each of the aforementioned embodiments has been described with reference to a ferroelectric capacitor element, the present invention is not restricted to this but an effect of suppressing reduction of a dielectric constant resulting from hydrogen or the like can be attained also when using a capacitor element employing an oxide paraelectric substance.

While the structure according to each of the aforementioned first to fourth embodiments includes only the capacitor element, the present invention is not restricted to this but is also applicable to a semiconductor memory formed by combining a capacitor element with a transistor. Further, the present invention is applicable not only to a capacitor element but also to a general element employing a dielectric substance.

While the tungsten plug 14 is employed as a plug electrode for connecting the lower electrode and the n-type doped layer 11 in each of the aforementioned embodiments, the present invention is not restricted to this but a polysilicon plug may alternatively be employed. When employing a tungsten plug or a polysilicon plug, a generally employed technique of forming a polysilicon plug or a tungsten plug can be applied as such. Thus, a stacked capacitor structure capable of preventing hydrogen from diffusing into the SBT film 22 can be readily manufactured.

While the lower electrode has a two-layer structure consisting of the IrSiN film 20 and the Pt film 21 in each of the aforementioned embodiments, the present invention is not restricted to this but the lower electrode may be formed by only a single layer.

What is claimed is:

1. A dielectric element comprising:
   a lower electrode including a first conductor film containing a metal, silicon and nitrogen;
   a first insulator film including an oxide dielectric film; and
   an upper electrode including a second conductor film containing said metal, silicon and nitrogen, wherein
     said metal includes at least one metal selected from a group consisting of Ir, Pt, Ru, Re, Ni, Co, Mo, and
     said metal contained in said first conductor film and said second conductor film is identical.

2. The dielectric element according to claim 1, wherein said first insulator film including said oxide dielectric film is enclosed with said lower electrode including said first conductor film, said upper electrode including said second conductor film and a second insulator film having low permeability for hydrogen.

3. The dielectric element according to claim 2, wherein said second insulator film having low permeability for hydrogen is removed in a region other than an element region formed with said first insulator film, said lower electrode and said upper electrode.

4. The dielectric element according to claim 2, wherein said second insulator film having low permeability for hydrogen includes at least any of a silicon nitride film, a silicon oxynitride film and an aluminum oxide film.

5. The dielectric element according to claim 1, wherein said first insulator film including said oxide dielectric film is formed to cover the upper surface and the side surface of said lower electrode while said upper electrode is formed to cover the upper surface and the side surface of said first insulator film.

6. The dielectric element according to claim 1, wherein said first conductor film is formed on a plug.

7. The dielectric element according to claim 6, wherein said plug includes either a polysilicon plug or a tungsten plug.

8. The dielectric element according to claim 1, wherein said lower electrode includes:
    said first conductor film consisting of an IrSiN film, and
    a Pt film formed on said first conductor film.

9. The dielectric element according to claim 1, wherein said upper electrode includes:
    said second conductor film consisting of an IrSiN film, and
    a Pt film formed on said second conductor film.

10. The dielectric element according to claim 1, wherein said upper electrode includes:
    a Pt film, and
    said second conductor film, formed on said Pt film, consisting of an IrSiN film.

11. The dielectric element according to claim 1, wherein said first insulator film including said oxide dielectric film includes an SBT film.

* * * * *